(12) United States Patent
Kim et al.

(10) Patent No.: US 8,331,162 B2
(45) Date of Patent: Dec. 11, 2012

(54) SEMICONDUCTOR MEMORY DEVICE HAVING HIERARCHICAL BIT LINE STRUCTURE AND METHOD OF DRIVING THE SEMICONDUCTOR MEMORY DEVICE

(75) Inventors: Jin-young Kim, Seoul (KR); Ki-whan Song, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 310 days.

(21) Appl. No.: 12/662,222

(22) Filed: Apr. 6, 2010

(65) Prior Publication Data

US 2011/0013464 A1    Jan. 20, 2011

(30) Foreign Application Priority Data

Jul. 14, 2009    (KR) .................. 10-2009-0064084

(51) Int. Cl.
*G11C 7/10*    (2006.01)
(52) U.S. Cl. ............... 365/189.05; 365/189.08; 365/202
(58) Field of Classification Search ............ 365/189.05, 365/189.08, 205, 202, 230.08
See application file for complete search history.

(56) References Cited

U.S. PATENT DOCUMENTS

| | | | | |
|---|---|---|---|---|
| 6,625,066 | B1* | 9/2003 | Parris et al. | 365/189.02 |
| 6,956,780 | B2* | 10/2005 | Kyung | 365/205 |
| 7,180,817 | B2* | 2/2007 | Mochida | 365/230.03 |
| 7,289,385 | B2* | 10/2007 | Kwak | 365/230.03 |
| 7,376,027 | B1* | 5/2008 | Chung et al. | 365/202 |
| 7,555,659 | B2* | 6/2009 | Lines | 713/300 |
| 2008/0123447 | A1* | 5/2008 | Chung et al. | 365/202 |

FOREIGN PATENT DOCUMENTS

| | | |
|---|---|---|
| JP | 11-053881 | 2/1999 |
| JP | 11-096750 | 4/1999 |
| KR | 97-23404 | 5/1997 |

* cited by examiner

*Primary Examiner* — Gene Auduong
(74) *Attorney, Agent, or Firm* — Harness, Dickey & Pierce, P.L.C.

(57) ABSTRACT

The semiconductor memory device includes a first memory cell array including at least one first memory cell and at least one second memory cell corresponding to the at least one first memory cell, a first low bit line connected to the at least one first memory cell, a first low complementary bit line connected to the at least one second memory cell, a first switch unit having a first terminal connected to the first low bit line, a second switch unit having a first terminal connected to the first low complementary bit line, a first global bit line connected to a second terminal of the first switch unit, a first global complementary bit line connected to a second terminal of the second switch unit, and a plurality of sensing amplifying units connected to the first global bit line and the first global complementary bit line.

11 Claims, 4 Drawing Sheets

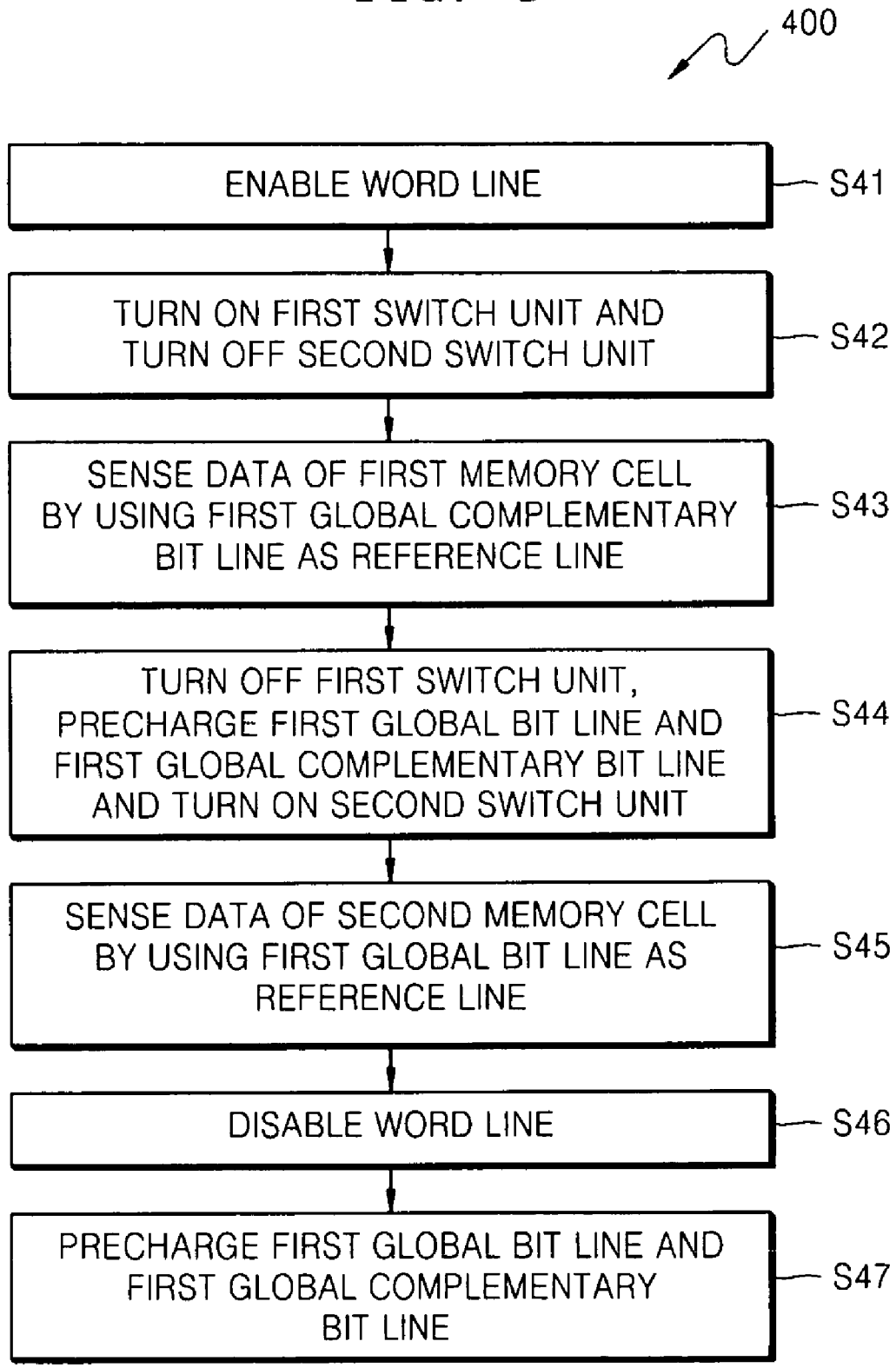

SEMICONDUCTOR MEMORY DEVICE HAVING HIERARCHICAL BIT LINE STRUCTURE AND METHOD OF DRIVING THE SEMICONDUCTOR MEMORY DEVICE

CROSS-REFERENCE TO RELATED APPLICATIONS

This application claims priority under 35 U.S.C. §119 to Korean Patent Application No. 10-2009-0064084, filed on Jul. 14, 2009 in the Korean Intellectual Property Office (KIPO), the entire contents of which are incorporated herein by reference.

BACKGROUND

Example embodiments of the inventive concepts relate to a semiconductor memory device having a hierarchical bit line structure and a method of driving the semiconductor memory device, and more particularly, to a semiconductor memory device having a hierarchical bit line structure using a folded bit line structure.

In order to increase the integration density of a semiconductor memory device, conventional semiconductor memory devices, may use a hierarchical bit line structure. Conventional semiconductor memory devices having a hierarchical bit line structure, may use an open bit line structure. In the conventional semiconductor memory device having the hierarchical bit line structure using the open bit line method, adjacent memory cells connected to the same word line may be simultaneously sensed by different bit lines and different sensing amplifiers, and coupling noise may occur between adjacent bit lines. In addition, since the conventional semiconductor memory device having the hierarchical bit line structure using the open bit line structure may need to include sensing amplifiers for every two pitches of a bit line, an area ratio of the sensing amplifiers with respect to the semiconductor memory device may not be small, and thus it may be difficult to obtain a semiconductor memory device with high integration density.

SUMMARY

Example embodiments of the inventive concepts provide a semiconductor memory device having a hierarchical bit line structure using a folded bit line structure and a method of driving the semiconductor memory device, whereby coupling noise may be reduced.

Example embodiments of the inventive concepts provide a semiconductor memory device which may include a first memory cell array including at least one first memory cell and at least one second memory cell corresponding to the at least one first memory cell; a first low bit line connected to the at least one first memory cell; a first low complementary bit line connected to the at least one second memory cell; a first switch unit having a first terminal connected to the first low bit line, wherein the first switch unit is configured to be switched on or off based on a first switch control signal; a second switch unit having a first terminal connected to the first low complementary bit line, wherein the second switch unit is configured to be switched on or off based on a second switch control signal; a first global bit line connected to a second terminal of the first switch unit; a first global complementary bit line connected to a second terminal of the second switch unit; and a plurality of sensing amplifying units including at least one sensing amplifying unit connected to the first global bit line and the first global complementary bit line, wherein the first global bit line and the first global complementary bit line are connected to the same memory cell array.

The semiconductor memory device may further include a second global bit line connected to the sensing amplifying unit in an opposite direction to that of the first global bit line; a second global complementary bit line connected to the sensing amplifying unit in an opposite direction to that of the first global complementary bit line; a third switch unit having a first terminal connected to the second global bit line, wherein the third switch unit is configured to be switched on or off based on a third switch control signal; a fourth switch unit having a first terminal connected to the second global complementary bit line, wherein the fourth switch unit is configured to be switched on or off based on a fourth switch control signal; a second low bit line connected to a second terminal of the third switch unit; a second low complementary bit line connected to a second terminal of the fourth switch unit; a second memory cell array including at least one first memory cell connected to the second low bit line and at least one second memory cell connected to the second low complementary bit line; a first isolation switch unit connected between the first global bit line and the sensing amplifying unit and between the first global complementary bit line and the sensing amplifying unit, wherein whether the first isolation switch unit is configured to be switched on or off based on a first isolation switch control signal; and a second isolation switch unit connected between the second global bit line and the sensing amplifying unit and between the second global complementary bit line and the sensing amplifying unit, wherein the second isolation switch unit is configured to be switched on or off based on a second isolation switch control signal, wherein only one of the first isolation switch unit and the second isolation switch unit is selectively turned on.

The at least one first memory cell may correspond to the at least one second memory cell, and the at least one first memory cell and the at least one second memory cell, corresponding to each other, may be connected to the same word line.

The first switch unit and the second switch unit may be configured so that only one of the first switch unit and the second switch unit may be selectively turned on.

The first switch unit and the second switch unit may be configured so that when data of the at least one first memory cell is read or data is written to the at least one first memory cell, the first switch unit is turned on and the second switch unit may be turned off so that the first global complementary bit line operates as a reference line.

The first switch unit and the second switch unit may be configured so that when data of the at least one second memory cell is read or data is written to the at least one second memory cell, the second switch may be turned on and the first switch unit may be turned off so that the first global bit line operates as a reference line.

The at least one sensing amplifying unit may include a latch unit temporally storing data read from the at least one first memory cell or the at least one second memory cell.

The plurality of the sensing amplifying units may be arranged as one of the plurality of sensing amplifying units for every four pitches of a bit line.

According to another aspect of the inventive concept, there is provided a method of driving a semiconductor memory device, the method including enabling a word line connected to n first memory cells and n second memory cells; turning on a first switch unit connected to the n first memory cells, and turning off a second switch unit connected to the n second memory cells; sensing data of the n first memory cells by using a first global complementary bit line connected to the second switch unit as a reference line; turning off the first switch unit connected to the n first memory cells, and precharging a first global bit line and the first global complementary bit line; turning on the second switch unit connected to the n second memory cells; sensing data of the n second memory cells by using the first global bit line connected to the first switch unit as a reference line; disabling the word line; and precharging the first global bit line and the first global complementary bit line.

The method may further include latching the data of the n first memory cells; latching the data of the n second memory cells; and simultaneously outputting the data of the n first memory cells and the data of the n second memory cells, from the n first memory cells and the n second memory cells.

The word line may be further connected to n third memory cells and n fourth memory cells. The method may further comprise enabling a word line connected to the n third memory cells and the n fourth memory cells, turning on a third switch unit connected to the n third memory cells, and turning off a fourth switch unit connected to the n fourth memory cells; sensing data of the n third memory cells by using a second global complementary bit line connected to the fourth switch unit as a reference line, simultaneously latching the data of the n first memory cells and data of the n third memory cells; and outputting the data of the n first memory cells and the data of the n third memory cells, from the n first memory cells and the n third memory cells.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

FIG. 4 is a flowchart of a method of driving a semiconductor memory device, according to example embodiments of the inventive concepts.

DETAILED DESCRIPTION OF THE EMBODIMENTS

Figure 1:
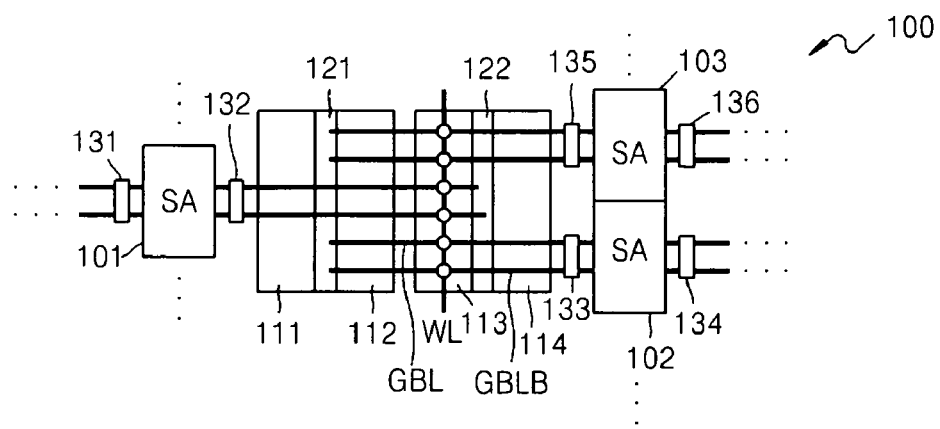
FIG. 1 is a diagram of a portion of a semiconductor memory device according to example embodiments of the inventive concepts.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a diagram of a portion of a semiconductor memory device 100 according to example embodiments of the inventive concepts. Referring to FIG. 1, the semiconductor memory device 100 may include a plurality of memory cell arrays 111, 112, 113 and 114, a plurality of switch blocks 121 and 122, and a plurality of sensing amplifying units 101, 102 and 103. The semiconductor memory device 100 may further include a plurality of pairs of isolation switch units 131 and 132, 133 and 134, and 135 and 136, which correspond to the sensing amplifying units 101, 102 and 103, respectively. FIG. 1 is a diagram of a portion of the semiconductor memory device 100, and thus the semiconductor memory device 100 may be configured by repeatedly forming the structure illustrated in FIG. 1. According to example embodiments of the inventive concepts, the semiconductor memory device 100 may include the sensing amplifying units 101, 102 and 103 for every four pitches of a bit line.

Each of the memory cell arrays 111, 112, 113 and 114 may include at least one memory cell, and each memory cell may be connected to a word line and a bit line. The switch blocks 121 and 122 may be connected to a global bit line GBL and a global complementary bit line GBLB, and may determine whether the global bit line GBL and the global complementary bit line GBLB are electrically connected to at least one memory cell.

The sensing amplifying units 101, 102 and 103 may sense data stored in a memory cell selected by the word line through the global bit line GBL and the global complementary bit line GBLB. The pairs of isolation switch units 131 and 132, 133 and 134, and 135 and 136 may correspond to the sensing amplifying units 101, 102 and 103, respectively, and may determine which memory cell is sensed by the sensing amplifying units 101, 102 and 103.

The memory cell arrays 111, 112, 113 and 114, the switch blocks 121 and 122, the sensing amplifying units 101, 102 and 103, and the isolation switch units 131, 132, 133, 134, 135 and 136 will be described in greater detail with reference to FIG. 2.

Figure 2:
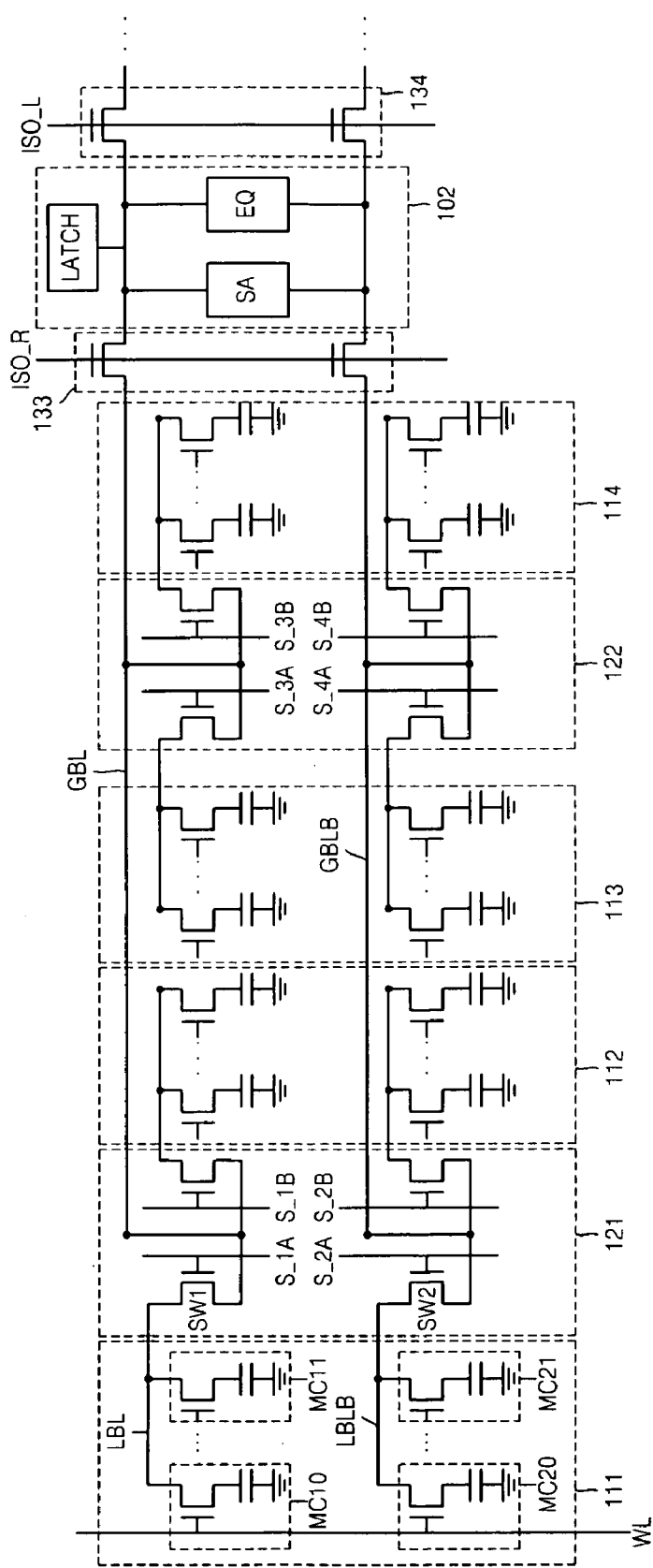
FIG. 2 is a diagram illustrating a portion of the semiconductor memory device of FIG. 1 in detail, according to example embodiments of the inventive concepts.

FIG. 2 is a diagram illustrating a portion of a semiconductor memory device of FIG. 1 in detail, according to example embodiments of the inventive concepts. FIG. 2 is a diagram illustrating the sensing amplifying unit 102, the memory cell arrays 111, 112, 113 and 114, the switch blocks 121 and 122, and the isolation switch units 133 and 134 of the semiconductor memory device of FIG. 1, in detail.

Referring to FIG. 2, a first memory cell array 111 may include first memory cells MC10 and MC11 and second memory cells MC20 and MC21. The first memory cells MC10 and MC11 may correspond to the second memory cells MC20 and MC21. As an example, the first memory cell MC10 may correspond to the second memory cell MC20, and the first memory cell MC11 may correspond to the second memory cell MC21. Like the case where the first memory cell MC10 and the second memory cell MC20 are connected to a word line WL, memory cells corresponding to each other may be connected to the same word line. The first memory cells MC10 and MC11 and the second memory cells MC20 and MC21 may be configured as a dynamic random access memory (DRAM) cell including a single cell transistor and a single cell capacitor.

A first low bit line LBL may be connected to each of the first memory cells MC10 and MC11. In addition, the first low bit line LBL may be connected to a switch block 121. That is, the first low bit line LBL may be connected between the first memory cells MC10 and MC11, and the switch block 121.

A first low complementary bit line LBLB may be connected to each of the second memory cells MC20 and MC21. In addition, the first low complementary bit line LBLB may be connected to the switch block 121. That is, the first low complementary bit line LBLB may be connected between the second memory cells MC20 and MC21, and the switch block 121.

Referring to FIG. 2, the switch block 121 may include first and second switch units SW1 and SW2. A first switch unit SW1 may be connected between the first low bit line LBL and the first global bit line GBL, and the second switch unit SW2 may be connected between the first low complementary bit line LBLB and the first global complementary bit line GBLB. Whether the first switch unit SW1 is switched on or off may be determined in response to a first switch control signal S_1A, and whether the second switch unit SW2 is switched on or off may be determined in response to a second switch control signal S_2A. The first switch control signal S_1A and the second switch control signal S_2A may be generated by a memory controller (not shown), and may be respectively applied to the first switch unit SW1 and the second switch unit SW2.

The first global bit line GBL and the first global complementary bit line GBLB may be connected to the memory cell arrays 111, 112, 113 and 114 through the switch blocks 121 and 122. According to whether the switch units contained in the switch blocks 121 and 122 are switched on or off, a memory cell array that is electrically connected to the first global bit line GBL and the first global complementary bit line GBLB may be determined. Switch block 121 may also received third and fourth switch control signals S_1B and S_2 B which may be connected to third and fourth switches, respectively, and may operate in the same manner as first and second control signals S_1A and S_2A. Switch block 122 may receive fifth, sixth, seventh and eighth control signals S_3A, S_3B, S_4A, and S_4B, which may be connected to fifth, sixth, seventh and eighth switches, respectively, and may operate in the same manner as first, second third and fourth control signals S_1A, S_2A, S_1B, and S_2B.

The sensing amplifying unit 102 may be connected to the first global bit line GBL and the first global complementary bit line GBLB. As illustrated in FIG. 2, the first global bit line GBL and the first global complementary bit line GBLB may be connected to the same memory cell array, and thus the first global bit line GBL and the first global complementary bit line GBLB may be connected in the sensing amplifying unit 102 in parallel.

Referring to FIG. 2, the sensing amplifying unit 102 may include a sense amplifier SA, an equalizer EQ, and a latch unit LATCH. The sense amplifier SA may read data of a memory cell selected by the word line WL or may write data to a memory cell selected by the word line WL, by sensing and amplifying a voltage of the first global bit line GBL and a voltage of the first global complementary bit line GBLB. After an operation of the sense amplifier SA, the equalizer EQ may equalize the voltage of the first global bit line GBL and the voltage of the first global complementary bit line GBLB to a reference voltage. The latch unit LATCH may temporally store data read from the memory cell selected by the word line WL.

As illustrated in FIG. 2, the semiconductor memory device according to example embodiments of the inventive concepts may further include a first isolation switch unit 133 and a second isolation switch unit 134. The first isolation switch unit 133 may be connected between both the first global bit line GBL and the first global complementary bit line GBLB, and the sensing amplifying unit 102. The second isolation switch unit 134 and the first isolation switch unit 133 may be connected to be symmetric within the sensing amplifying unit 102. Although not illustrated in FIG. 2, memory cell arrays, switch blocks, a global bit line and a global complementary bit line corresponding to the memory cell arrays 111, 112, 113 and 114, the switch blocks 121 and 122, and the first global bit line GBL and the global complementary bit line GBLB connected to the first isolation switch unit 133 may be connected to the right of the second isolation switch unit 134. According to example embodiments of the inventive concepts, in addition to the first and second isolation switch units 133 and 134, elements corresponding to the memory cell arrays 111, 112, 113 and 114, the switch blocks 121 and 122, and the first global bit line GBL and the global complementary bit line GBLB, may be symmetrically arranged with respect to the sensing amplifying unit 102.

The first isolation switch unit 133 may receive a first isolation switch control signal ISO_R, and then it may be determined whether the first isolation switch unit 133 is switched on or off, in response to the first isolation switch control signal ISO_R. In addition, the second isolation switch unit 134 may receive a second isolation switch control signal ISO_L, and then it may be determined whether the second isolation switch unit 134 is switched on or off, in response to the second isolation switch control signal ISO_L. The sensing amplifying unit 102 may select any one memory cell array from among a plurality of memory cell arrays connected to both sides of the sensing amplifying unit 102 so as to perform a sensing operation, and thus only one of the first isolation switch unit 133 and the second isolation switch unit 134 may be turned on. That is, the first isolation switch control signal ISO_R and the second isolation switch control signal ISO_L may not be simultaneously activated.

A detailed operation of the semiconductor memory device of FIG. 2 will be described with reference to FIG. 3.

Figure 3:
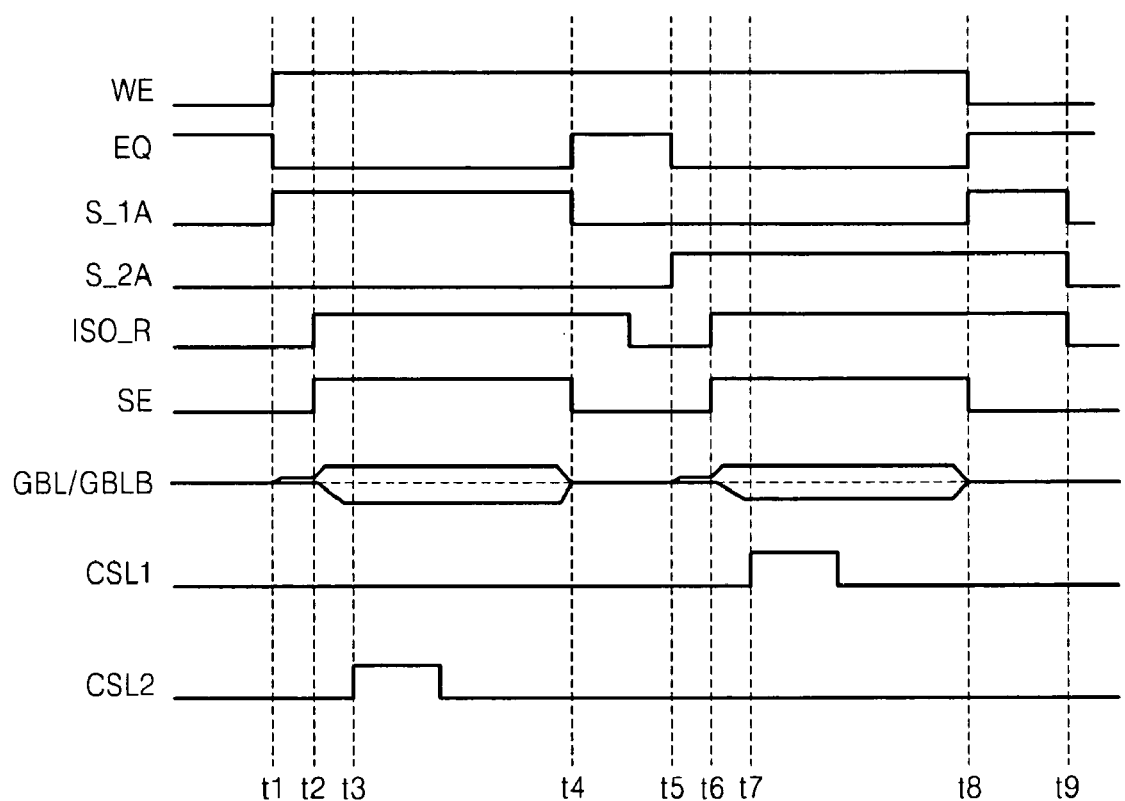
FIG. 3 is a timing diagram for explaining an operation of the semiconductor memory device of FIG. 2, according to example embodiments of the inventive concepts.

FIG. 3 is a timing diagram for explaining an operation of the semiconductor memory device of FIG. 2, according to example embodiments of the inventive concepts. Referring to FIG. 3, waveforms of a word line enable signal WE, an equalizing signal EQ, a first switch control signal S_1A, a second switch control signal S_2A, a first isolation switch control switch ISO_R, a sense amplifier enable signal SE, a first global bit line and a first global complementary bit line signal GBL/GBLB, and column selection signals CSL1 and CSL2 are illustrated. The waveforms illustrated in FIG. 3 are for illustrative purposes only in order to explain the operation of the semiconductor memory device of FIG. 2, and thus it will be understood that various changes in form and details may be made thereto.

Referring to FIGS. 2 and 3, at 't1', the word line enable signal WE transits to a logic high state. The word line enable signal WE of FIG. 3 is a signal applied to the word line WL connected to the first memory cell MC10 and the second memory cell MC20 of FIG. 2. When the word line enable signal WE is in a logic high state, the first memory cell MC10 and the second memory cell MC20 may be selected, and then cell transistors of the first memory cell MC10 and the second memory cell MC20 may be turned on. At 't1', the first switch control signal S_1A transits to a logic high state, and thus the first switch unit SW1 may be turned on, and then the first low bit line LBL and the first global bit line GBL may be electrically connected.

At 't1', a cell transistor of the first memory cell MC10 and the first switch unit SW1 may be turned on, and thus a cell capacitor of the first memory cell MC10 and the first global bit line GBL may share electric charges. At this time, since prior to t1, the first global bit line GBL is precharged to Vcc/2, a voltage level of the first global bit line GBL between 't1' and 't2' may be determined according to data stored in the cell capacitor of the first memory cell MC10. In FIG. 3, it is assumed that logic high "1" is stored in the first memory cell MC10. As illustrated in FIG. 3, the voltage level of the first global bit line GBL between 't1' and 't2' may increase slightly.

Like the first global bit line GBL, the first global complementary bit line GBLB is precharged to Vcc/2, prior to 't1'. Since the second switch control signal S_2A may be maintained in a logic low state between 't1' and 't2', the second switch unit SW2 may be maintained in a turn off state. Thus, as illustrated in FIG. 3, the first global complementary bit line GBLB is maintained in a voltage level of Vcc/2 between 't1' and 't2'. That is, the first global complementary bit line GBLB may operate as a reference line during the sensing operation of the sense amplifier SA.

Next, at 't2', the first isolation switch control switch ISO_R and the sense amplifier enable signal SE transit to a logic high state. When the first isolation switch control switch ISO_R is in a logic high state, the first isolation switch unit 133 is turned on, and therefore the first global bit line GBL and the sensing amplifying unit 102 may be electrically connected. Since, at 't2', the sense amplifier enable signal SE transits to a logic high state, the sensing operation of the sense amplifier SA may be performed between 't2' and 't3'. At this time, a voltage level of the first global bit line GBL may be increased to Vcc, and a voltage level of the first global complementary bit line GBLB may be reduced to 0 V. The sensing operation of the sense amplifier SA is well known to one of ordinary skill in the art, and thus the detailed description thereof will be omitted.

Next, at 't3', the sensing operation of the sense amplifier SA may be complete, and data of the first memory cell MC10 selected by the word line WL may be restored between 't3' and 't4'.

Next, since, at 't4', the first switch control signal S_1A transits to a logic low state, the first switch unit SW1 may be turned off, and then data is stored in the first memory cell MC10. The sense amplifier enable signal SE transits to a logic low state, and the equalizing signal EQ transits to a logic high state. Thus, an equalizing operation of the first global bit line GBL and the first global complementary bit line GBLB may be performed between 't4' and 't5'. That is, both voltage levels of the first global bit line GBL and the first global complementary bit line GBLB are precharged to Vcc/2.

Next, at 't5', the second switch control signal S_2A transits to a logic high state. At this time, since the first switch control signal S_1A is maintained in a logic low state, the first switch unit SW1 may be maintained in a turn-off state, and the second switch unit SW2 may be turned on. Thus, the second memory cell MC20 selected by the word line WL and the first global complementary bit line GBLB may be electrically connected.

The data of the second memory cell MC20 may be sensed by the sense amplifier SA, and may be restored between 't5' and 't8'. The sensing and restoring operations of the second memory cell MC20 may be similar to those of the first memory cell MC10, and thus a detailed description of the sensing and restoring operations of the second memory cell MC20 will be omitted here.

Next, since, at 't8', the word line enable signal WE transits to a logic low state, cell transistors of the first memory cell MC10 and the second memory cell MC20 may be turned off. Thus, the first memory cell MC10 and the second memory cell MC20 may be electrically isolated from the first low bit line LBL and the first low complementary bit line LBLB, respectively.

In addition, since, between 't8' and 't9', the first switch control signal S_1A, the second switch control signal S_2A and the first isolation switch control signal ISO_R are in a logic high state, the first global bit line GBL and the first low bit line LBL may be electrically connected, and the first global complementary bit line GBLB and the first low complementary bit line LBLB may be electrically connected. Since the equalizing signal EQ is in a logic high state, the first global bit line GBL, the first low bit line LBL, the first global complementary bit line GBLB and the first low complementary bit line LBLB are precharged to Vcc/2, between 't8' and 't9'.

In FIG. 3, when a period between 't1' and 't5' is referred to as a first cycle, and a period between 't5' and 't9' is referred to as a second cycle, data of the first memory cell MC10 may be read or written during the first cycle, and data of the second memory cell MC20 may be read or written during the second cycle. During the first cycle, the first memory cell MC10 may be connected to the sensing amplifying unit 102 by the first low bit line LBL and the first global bit line GBL, and the global complementary bit line GBLB may operate as a reference line. During the second cycle, the second memory cell MC20 may be connected to the sensing amplifying unit 102 by the first low complementary bit line LBLB and the global complementary bit line GBLB, and the first global bit line GBL may operate as a reference line.

According to example embodiments of the inventive concepts, the semiconductor memory device may use a folded bit line structure in which the first global bit line GBL and the global complementary bit line GBLB are connected to the same sensing amplifying unit. In order to sense a memory cell connected to the first global bit line GBL, the global complementary bit line GBLB may be used as a reference line. In order to sense a memory cell connected to the global complementary bit line GBLB, the first global bit line GBL may be used as a reference line. Thus, in the semiconductor memory device according to example embodiments of the inventive concepts, only one of the first switch unit SW1 and the second switch unit SW2 is turned on, and memory cells are not simultaneously sensed through the first global bit line GBL and the global complementary bit line GBLB, thereby reducing coupling noise generated between adjacent bit lines.

In addition, unlike a conventional semiconductor memory device having a hierarchical bit line structure using a general open bit line structure which may require sensing amplifying units for every two pitches of a bit line, the semiconductor memory device according to example embodiments of the inventive concepts may use a folded bit line structure, and thus the semiconductor memory device may include sensing amplifying units for every four pitches of a bit line.

Referring to FIG. 3, in accordance with two different data outputting methods, the column selection signals CSL1 and CSL2 may be applied to the semiconductor memory device according to example embodiments of the inventive concepts. As an example, the column selection signal CSL1 may be a column selection signal of a 1 KB page operation, and the column selection signal CSL2 may be a column selection signal of a 2 KB page operation.

In the 1 KB page operation, during the first cycle between 't1' and 't5', data of n first memory cells may be sensed and stored in the latch unit LATCH. In addition, during the second cycle between 't5' and 't9', data of n second memory cells may be sensed and stored in the latch unit LATCH. The data of the n first memory cells and n second memory cells may then be simultaneously output from the latch unit LATCH.

On the other hand, in the 2 KB page operation, during the first cycle between 't1' and 't5', data of 2n first memory cells may be sensed and stored in the latch unit LATCH, and then the data of the 2n first memory cells may be output from the latch unit LATCH. A data outputting operation according to the column selection signals CSL1 and CSL2 is well known to one of ordinary skill in the art, and thus a detailed description thereof will be omitted.

FIG. 4 is a flowchart of a method of driving a semiconductor memory device 400, according to example embodiments of the inventive concepts. Referring to FIG. 4, in operation S41, a word line connected to n first memory cells and n second memory cells may be enabled. In operation S42, a first switch unit connected to the n first memory cells may be turned on, and a second switch unit connected to the n second memory cells may be turned off. In operation S43, data of the n first memory cells may be sensed by using a first global complementary bit line connected to the second switch unit as a reference line. In operation S44, the first switch unit connected to the n first memory cells may be turned off, a first global bit line and the first global complementary bit line may be precharged, and the second switch unit connected to the n second memory cells may be turned on. In operation S45, data of the n second memory cells may be sensed by using the first global bit line connected to the first switch unit as a reference line. In operation S46, the word line may be disabled. In operation S47, the first global bit line and the first global complementary bit line may be precharged.

In the method of driving the semiconductor memory device 400, the above-described 1 KB page operation and 2 KB page operation may be used. When performing the 1 KB page operation, the method of driving the semiconductor memory device 400 may further include the operations of latching the data of the n first memory cells; latching the data of the n second memory cells; and simultaneously outputting the data of the n first memory cells and the data of the n second memory cells. In addition, when performing the 2 KB page operation, the word line may be further connected to n third memory cells and n fourth memory cells, and data of the n third memory cells may be sensed by using the same method as in the n first memory cells. The method 400 of driving the semiconductor memory device may further include the operations of simultaneously latching the data of the n first memory cells and data of the n third memory cells; and outputting the data of the n first memory cells and the data of the n third memory cells.

In the method 400 of driving the semiconductor memory device, a third memory cell and a fourth memory cell may be configured as a DRAM cell including a single cell transistor and a single cell capacitor. The method 400 of driving the semiconductor memory device has been described with reference to FIGS. 2 and 3, and thus a detailed description thereof will be omitted.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A semiconductor memory device comprising:
   a first memory cell array including at least one first memory cell and at least one second memory cell corresponding to the at least one first memory cell;
   a first low bit line connected to the at least one first memory cell;
   a first low complementary bit line connected to the at least one second memory cell;
   a first switch unit having a first terminal connected to the first low bit line, the first switch unit being configured to be switched on or off based on a first switch control signal;
   a second switch unit having a first terminal connected to the first low complementary bit line, the second switch unit being configured to be switched on or off based on a second switch control signal;
   a first global bit line connected to a second terminal of the first switch unit;
   a first global complementary bit line connected to a second terminal of the second switch unit;
   a plurality of sensing amplifying units including at least one sensing amplifying unit connected to the first global bit line and the first global complementary bit line; and
   a first isolation switch unit connected between the first global bit line and the at least one sensing amplifying unit, the first isolation switch also being connected between the first global complementary bit line and the at least one sensing amplifying unit, the first isolation switch unit being configured to be switched on or off based on a first isolation switch control signal,
   wherein the first global bit line and the first global complementary bit line are connected to the same memory cell array.

2. The semiconductor memory device of claim 1, further comprising:
- a second global bit line connected to the at least one sensing amplifying unit in an opposite direction to that of the first global bit line;
- a second global complementary bit line connected to the at least one sensing amplifying unit in an opposite direction to that of the first global complementary bit line;
- a third switch unit having a first terminal connected to the second global bit line, the third switch unit being configured to be switched on or off based on a third switch control signal;
- a fourth switch unit having a first terminal connected to the second global complementary bit line, the four the switch unit being configured to be switched on or off based on a fourth switch control signal;
- a second low bit line connected to a second terminal of the third switch unit;
- a second low complementary bit line connected to a second terminal of the fourth switch unit;
- a second memory cell array comprising at least one first memory cell connected to the second low bit line and at least one second memory cell connected to the second low complementary bit line; and
- a second isolation switch unit connected between the second global bit line and the at least one sensing amplifying unit, the second isolation switch also being connected between the second global complementary bit line and the at least one sensing amplifying unit, the second isolation switch unit being configured to be switched on or off based on a second isolation switch control signal;
- wherein the first isolation switch and the second isolation switch are configured so that only one of the first isolation switch unit and the second isolation switch unit is selectively turned on.

3. The semiconductor memory device of claim 1, wherein the at least one first memory cell corresponds to the at least one second memory cell, and
wherein the at least one first memory cell and the at least one second memory cell, corresponding to each other, are connected to the same word line.

4. The semiconductor memory device of claim 3, wherein the first switch unit and the second switch unit are configured so that only one of the first switch unit and the second switch unit is selectively turned on.

5. The semiconductor memory device of claim 4, wherein, the first switch unit and the second switch unit are configured so that when data of the at least one first memory cell is read or data is written to the at least one first memory cell, the first switch unit is turned on and the second switch unit is turned off so that the first global complementary bit line operates as a reference line.

6. The semiconductor memory device of claim 5, wherein the first switch unit and the second switch unit are configured so that when data of the at least one second memory cell is read or data is written to the at least one second memory cell, the second switch is turned on and the first switch unit is turned off so that the first global bit line operates as a reference line.

7. The semiconductor memory device of claim 1, wherein the at least one sensing amplifying unit includes a latch unit temporally storing data read from the at least one first memory cell or the at least one second memory cell.

8. The semiconductor memory device of claim 1, wherein the plurality of sensing amplifying units are arranged as one of the plurality of sensing amplifying units for every four pitches of a bit line.

9. A method of driving a semiconductor memory device, the method comprising:
- enabling a word line connected to n first memory cells and n second memory cells;
- turning on a first switch unit connected to the n first memory cells, and turning off a second switch unit connected to the n second memory cells;
- sensing data of the n first memory cells by using a first global complementary bit line connected to the second switch unit as a reference line;
- turning off the first switch unit connected to the n first memory cells, and
- precharging a first global bit line and the first global complementary bit line;
- turning on the second switch unit connected to the n second memory cells;
- sensing data of the n second memory cells by using the first global bit line connected to the first switch unit as a reference line;
- disabling the word line; and
- precharging the first global bit line and the first global complementary bit line.

10. The method of claim 9, further comprising:
latching the data of the n first memory cells;
latching the data of the n second memory cells; and
simultaneously outputting the data of the n first memory cells and the data of the n second memory cells.

11. The method of claim 9, wherein the word line is further connected to n third memory cells and n fourth memory cells, the method further comprising:
- enabling a word line connected to the n third memory cells and the n fourth memory cells;
- turning on a third switch unit connected to the n third memory cells, and turning off a fourth switch unit connected to the n fourth memory cells;
- sensing data of the n third memory cells by using a second global complementary bit line connected to the fourth switch unit as a reference line;
- simultaneously latching the data of the n first memory cells and data of the n third memory cells; and
- outputting the data of the n first memory cells and the data of the n third memory cells.

* * * * *